(12) United States Patent
Hwang et al.

(10) Patent No.: US 12,389,657 B2
(45) Date of Patent: Aug. 12, 2025

(54) HIGH ELECTRON MOBILITY TRANSISTOR DEVICE AND MANUFACTURING METHOD THEREOF

(71) Applicant: Powerchip Semiconductor Manufacturing Corporation, Hsinchu (TW)

(72) Inventors: Robin Christine Hwang, Taipei (TW); Jih-Wen Chou, Hsinchu (TW); Hwi-Huang Chen, Hsinchu (TW); Hsin-Hong Chen, Hsinchu (TW); Yu-Jen Huang, Hsinchu (TW); Chih-Hung Lu, Taichung (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 391 days.

(21) Appl. No.: 18/300,372

(22) Filed: Apr. 13, 2023

(65) Prior Publication Data
US 2024/0274673 A1     Aug. 15, 2024

(30) Foreign Application Priority Data
Feb. 10, 2023    (TW) ................... 112104866

(51) Int. Cl.
*H10D 64/00*     (2025.01)
*H10D 30/01*     (2025.01)
(Continued)

(52) U.S. Cl.
CPC ......... *H10D 64/112* (2025.01); *H10D 30/015* (2025.01); *H10D 30/475* (2025.01); *H10D 62/8503* (2025.01); *H10D 64/01* (2025.01)

(58) Field of Classification Search
None
See application file for complete search history.

(56) References Cited

U.S. PATENT DOCUMENTS

| 11,302,807 | B2* | 4/2022 | Chen ..................... H10D 62/85 |
| 2022/0165874 | A1* | 5/2022 | Otake .................. H10D 30/475 |
| 2023/0019799 | A1 | 1/2023 | Park et al. | |

FOREIGN PATENT DOCUMENTS

| CN | 114975608 | 8/2022 |
| TW | 201914016 | 4/2019 |

(Continued)

OTHER PUBLICATIONS

"Notice of allowance of Taiwan Counterpart Application", issued on Sep. 7, 2023, p. 1-p. 4.

*Primary Examiner* — Nicholas J Tobergte
(74) *Attorney, Agent, or Firm* — JCIPRNET

(57) ABSTRACT

A HEMT device including a substrate structure, a channel layer, a barrier layer, a gate electrode, a drain electrode, a first source field plate, a second source field plate, and a dielectric structure is provided. The first source field plate extends from the second side of the gate electrode to the first side of the gate electrode. The second source field plate is located on the first side of the gate electrode and is located between the drain electrode and the first source field plate. There is a gap between the first source field plate and the second source field plate. The first source field plate has an end adjacent to the gap. The thickness of the dielectric structure located directly below the second source field plate is greater than the thickness of the dielectric structure located directly below the end of the first source field plate.

20 Claims, 10 Drawing Sheets

(51) Int. Cl.
*H10D 30/47* (2025.01)
*H10D 62/85* (2025.01)
*H10D 64/01* (2025.01)

(56) References Cited

FOREIGN PATENT DOCUMENTS

| | | |
|---|---|---|
| TW | 202042390 | 11/2020 |
| TW | 202230799 | 8/2022 |

\* cited by examiner

HIGH ELECTRON MOBILITY TRANSISTOR DEVICE AND MANUFACTURING METHOD THEREOF

CROSS-REFERENCE TO RELATED APPLICATION

This application claims the priority benefit of Taiwan application serial no. 112104866, filed on Feb. 10, 2023. The entirety of the above-mentioned patent application is hereby incorporated by reference herein and made a part of this specification.

BACKGROUND

Technical Field

The invention relates to a semiconductor device and a manufacturing method thereof, and particularly relates to a high electron mobility transistor (HEMT) device and a manufacturing method thereof.

Description of Related Art

The HEMT is a field effect transistor and can have higher breakdown voltage and higher reliability. However, how to further improve the electrical performance of the HEMT is the goal of continuous efforts.

SUMMARY

The invention provides a HEMT device and a manufacturing method thereof, which can increase the breakdown voltage of the HEMT device.

The invention provides a HEMT device, which includes a substrate structure, a channel layer, a barrier layer, a gate electrode, a drain electrode, a first source field plate, a second source field plate, and a dielectric structure. The channel layer is located on the substrate structure. The barrier layer is located on the channel layer. The gate electrode is located on the barrier layer. The gate electrode has a first side and a second side opposite to each other. The drain electrode is located on the first side of the gate electrode. The first source field plate extends from the second side of the gate electrode to the first side of the gate electrode. The second source field plate is located on the first side of the gate electrode and is located between the drain electrode and the first source field plate. There is a gap between the top-view pattern of the first source field plate and the top-view pattern of the second source field plate. The first source field plate has an end adjacent to the gap. The dielectric structure is located between the first source field plate and the gate electrode, between the first source field plate and the barrier layer, and between the second source field plate and the barrier layer. The thickness of the dielectric structure located directly below the second source field plate is greater than the thickness of the dielectric structure located directly below the end of the first source field plate.

According to an embodiment of the invention, in the HEMT device, the first source field plate and the second source field plate may be derived from the same material layer.

According to an embodiment of the invention, in the HEMT device, a portion of the first source field plate may be located directly above the gate electrode.

According to an embodiment of the invention, in the HEMT device, the first source field plate and the second source field plate may be electrically connected to each other.

According to an embodiment of the invention, in the HEMT device, the first source field plate may be directly connected to the second source field plate.

According to an embodiment of the invention, in the HEMT device, the first source field plate and the second source field plate may be separated from each other.

According to an embodiment of the invention, the HEMT device may further include an interconnect structure. The first source field plate and the second source field plate may be electrically connected to each other by the interconnect structure.

According to an embodiment of the invention, in the HEMT device, the dielectric structure may include a first dielectric layer, a second dielectric layer, and an etch stop layer. The first dielectric layer is located on the barrier layer. The second dielectric layer is located on the first dielectric layer. The etch stop layer is located between the first dielectric layer and the second dielectric layer.

According to an embodiment of the invention, in the HEMT device, the first dielectric layer and the etch stop layer may be located directly below the first source field plate. The second dielectric layer is not located directly below the first source field plate. The first dielectric layer, the etch stop layer, and the second dielectric layer may be located directly below the second source field plate.

According to an embodiment of the invention, in the HEMT device, the drain electrode may be connected to the channel layer.

According to an embodiment of the invention, in the HEMT device, the first source field plate located on the second side of the gate electrode may be connected to the channel layer.

According to an embodiment of the invention, the HEMT device may further include a P-type gallium nitride (P-type GaN (pGaN)) layer. The P-type gallium nitride layer is located between the gate electrode and the barrier layer.

According to an embodiment of the invention, in the HEMT device, the substrate structure may include a substrate, a nucleation layer, and a buffer layer. The nucleation layer is located on the substrate. The buffer layer is located on the nucleation layer.

The invention provides a manufacturing method of a HEMT device, which includes the following steps. A substrate structure is provided. A channel layer is formed on the substrate structure. A barrier layer is formed on the channel layer. A gate electrode is formed on the barrier layer. The gate electrode has a first side and a second side opposite to each other. A drain electrode, a first source field plate, and a second source field plate are formed. The drain electrode is located on the first side of the gate electrode. The first source field plate extends from the second side of the gate electrode to the first side of the gate electrode. The second source field plate is located on the first side of the gate electrode and is located between the drain electrode and the first source field plate. There is a gap between the top-view pattern of the first source field plate and the top-view pattern of the second source field plate. The first source field plate has an end adjacent to the gap. A dielectric structure is formed between the first source field plate and the gate electrode, between the first source field plate and the barrier layer, and between the second source field plate and the barrier layer. The thickness of the dielectric structure located directly below the second source field plate is greater than the thickness of the dielectric structure located directly below the end of the first source field plate.

According to an embodiment of the invention, in the manufacturing method of the HEMT device, the first source field plate and the second source field plate may be simultaneously formed by the same metal process.

According to an embodiment of the invention, in the manufacturing method of the HEMT device, the dielectric structure may include a first dielectric layer, a second dielectric layer, and an etch stop layer. The first dielectric layer is located on the barrier layer. The second dielectric layer is located on the first dielectric layer. The etch stop layer is located between the first dielectric layer and the second dielectric layer.

According to an embodiment of the invention, in the manufacturing method of the HEMT device, the first dielectric layer and the etch stop layer may be located directly below the first source field plate. The second dielectric layer is not located directly below the first source field plate. The first dielectric layer, the etch stop layer, and the second dielectric layer may be located directly below the second source field plate.

According to an embodiment of the invention, in the manufacturing method of the HEMT device, the method of forming the barrier layer, the first dielectric layer, the etch stop layer, and the second dielectric layer may include the following steps. A barrier material layer is formed on the channel layer. The gate electrode is formed on the barrier material layer. A first dielectric material layer is formed on the barrier material layer and the gate electrode. An etch stop material layer is formed on the first dielectric material layer. A second dielectric material layer is formed on the etch stop material layer. The second dielectric material layer is patterned to form the second dielectric layer and to expose the etch stop material layer. The etch stop material layer, the first dielectric material layer, and the barrier material layer are patterned to form the etch stop layer, the first dielectric layer, and the barrier layer and to expose the channel layer.

According to an embodiment of the invention, in the manufacturing method of the HEMT device, the method of forming the drain electrode, the first source field plate, and the second source field plate may include the following steps. A conductive material layer is formed on the channel layer and the dielectric structure. The conductive material layer is patterned to form the drain electrode, the first source field plate, and the second source field plate.

According to an embodiment of the invention, the manufacturing method of the HEMT device may further include the following step. A P-type gallium nitride layer is formed between the gate electrode and the barrier layer.

Based on the above description, in the HEMT device and the manufacturing method thereof according to the invention, the second source field plate is located between the drain electrode and the first source field plate. There is a gap between the top-view pattern of the first source field plate and the top-view pattern of the second source field plate. The first source field plate has an end adjacent to the gap. The thickness of the dielectric structure located directly below the second source field plate is greater than the thickness of the dielectric structure located directly below the end of the first source field plate. Therefore, the breakdown voltage of the HEMT device according to the invention can be increased. In addition, when the reliability test is performed on the HEMT device according to the invention, the dispersion of the turn-on resistance ($R_{on}$) of the HEMT device under multiple switching operations can be more concentrated. In this way, the HEMT device according to the invention can have better dynamic performance.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1H are cross-sectional views of a manufacturing process of a HEMT device according to some embodiments of the invention. FIG. 2 is a top view of the HEMT device in FIG. 1H. FIG. 1A to FIG. 1H are cross-sectional views taken along section line I-I' in FIG. 2. In the top view of the present embodiment, some components in the cross-sectional view are omitted to clearly illustrate the configuration relationship between the components in the top view.

Figure 1A:
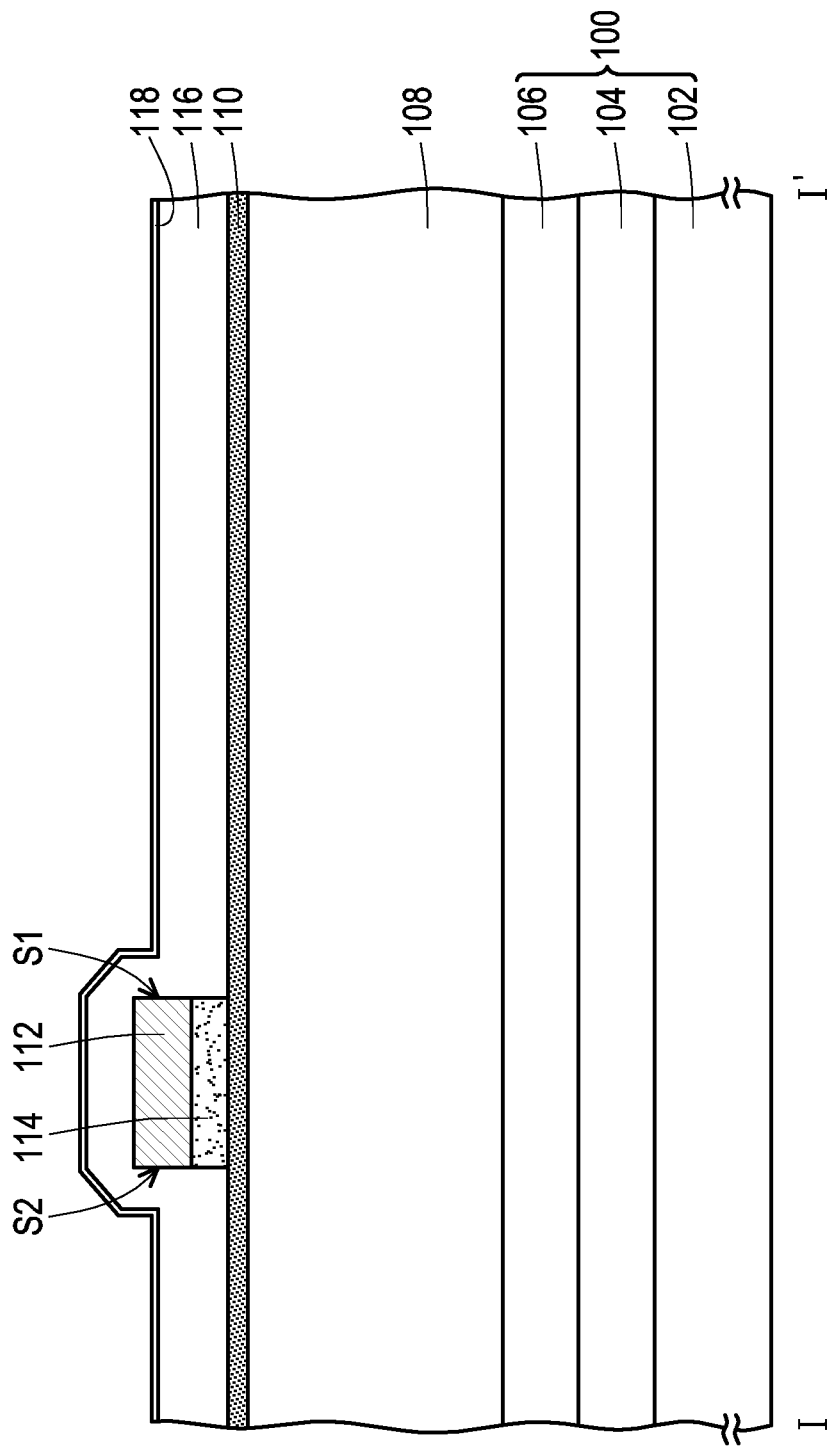
FIG. 1A to FIG. 1H are cross-sectional views of a manufacturing process of a HEMT device according to some embodiments of the invention.
Figure 2:
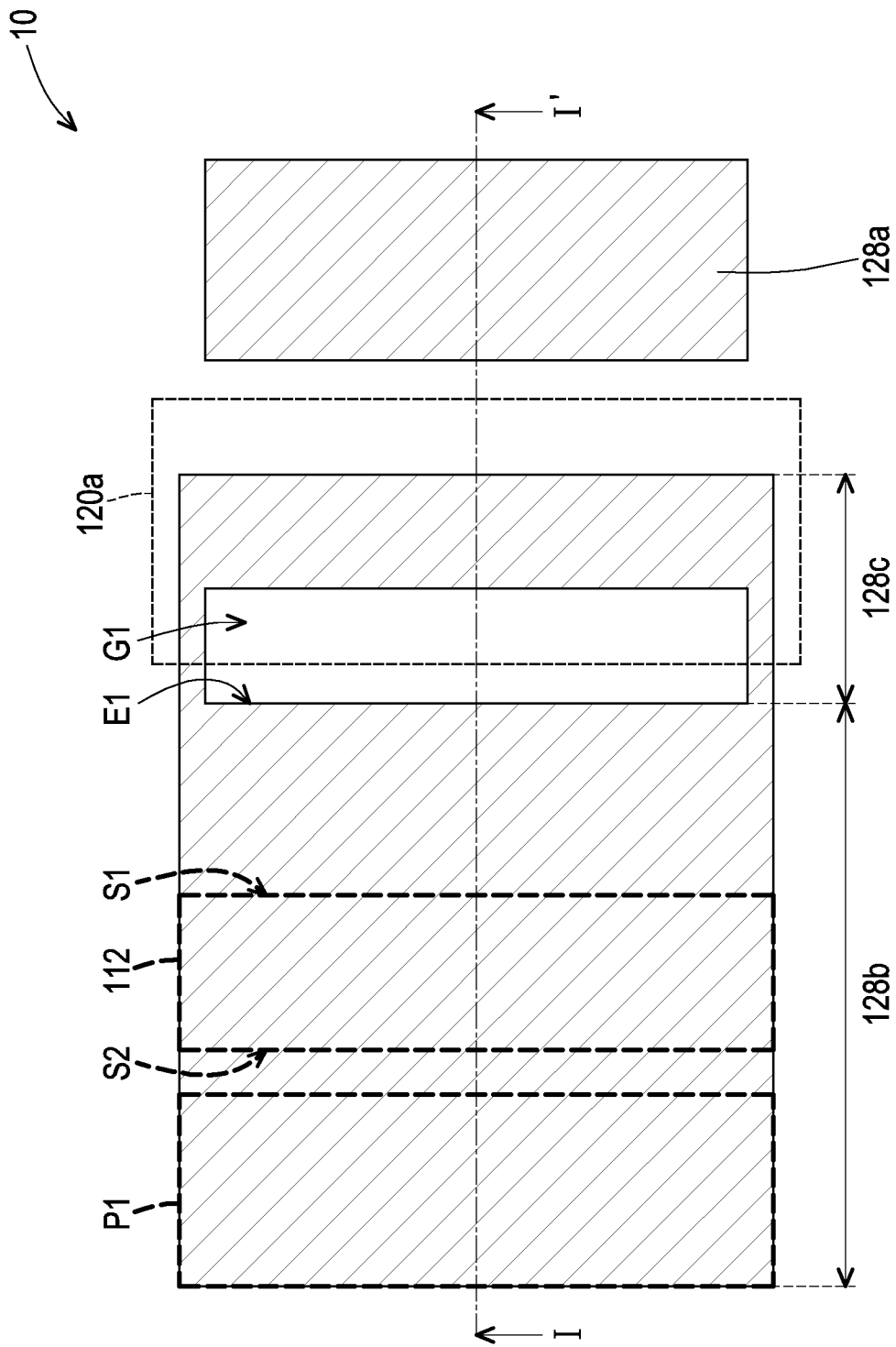
FIG. 2 is a top view of the HEMT device in FIG. 1H.

Referring to FIG. 1A, a substrate structure 100 is provided. In some embodiments, the substrate structure 100 may include a substrate 102, a nucleation layer 104, and a buffer layer 106. In some embodiments, the substrate 102 may be a semiconductor substrate such as a silicon substrate. The nucleation layer 104 is located on the substrate 102. In some embodiments, the material of the nucleation layer 104 is, for example, aluminum nitride (AlN). In some embodiments, the method of forming the nucleation layer 104 is, for example, an epitaxial growth method. The buffer layer 106 is located on the nucleation layer 104. In some embodiments, the material of the buffer layer 106 is, for example, aluminum gallium nitride (AlGaN) or aluminum nitride. In some embodiments, the method of forming the buffer layer 106 is, for example, an epitaxial growth method.

A channel layer 108 is formed on the substrate structure 100. In some embodiments, the channel layer 108 may be formed on the buffer layer 106. In some embodiments, the material of the channel layer 108 is, for example, gallium nitride (GaN). In some embodiments, the method of forming the channel layer 108 is, for example, an epitaxial growth method.

A barrier material layer 110 may be formed on the channel layer 108. In some embodiments, the material of the barrier material layer 110 is, for example, aluminum gallium nitride. In some embodiments, the method of forming the barrier material layer 110 is, for example, an epitaxial growth method.

A gate electrode 112 may be formed on the barrier material layer 110. The gate electrode 112 has a first side S1 and a second side S2 opposite to each other. In some embodiments, the material of the gate electrode 112 is, for example, titanium nitride (TiN), but the invention is not limited thereto. In some embodiments, a P-type gallium nitride layer 114 may be formed between the gate electrode 112 and the barrier material layer 110.

In some embodiments, the method of forming the gate electrode 112 and the P-type gallium nitride layer 114 may include the following steps. First, a P-type gallium nitride material layer (not shown) and a gate electrode material layer (not shown) may be sequentially formed on the barrier material layer 110. In some embodiments, the method of forming the P-type gallium nitride material layer is, for example, an epitaxial growth method. In some embodiments, the method of forming the gate electrode material layer is, for example, a chemical vapor deposition (CVD) method or a physical vapor deposition (PVD) method. Then, the gate electrode material layer and the P-type gallium nitride material layer may be patterned by a lithography process and an etching process (e.g., dry etching process) to form the gate electrode 112 and the P-type gallium nitride layer 114.

A dielectric material layer 116 may be formed on the barrier material layer 110 and the gate electrode 112. The dielectric material layer 116 may cover the barrier material layer 110, the gate electrode 112, and the P-type gallium nitride layer 114. In some embodiments, the material of the dielectric material layer 116 is, for example, silicon oxide or silicon nitride. In some embodiments, the method of forming the dielectric material layer 116 is, for example, a CVD method.

An etch stop material layer 118 may be formed on the dielectric material layer 116. In some embodiments, the material of the etch stop material layer 118 is, for example, aluminum oxide ($Al_2O_3$) or aluminum nitride. In some embodiments, the method of forming the etch stop material layer 118 is, for example, an atomic layer deposition (ALD) method.

Figure 1B:
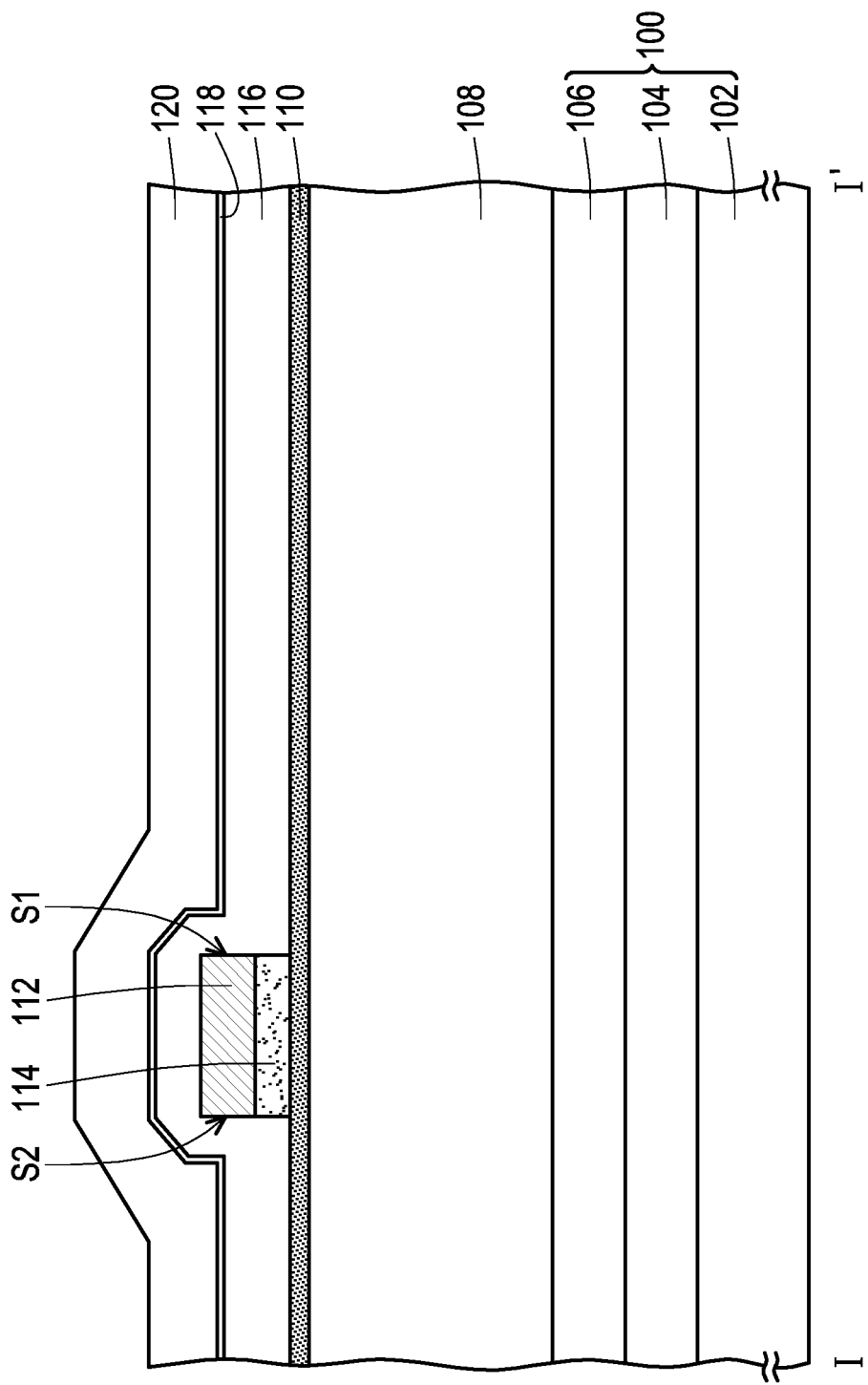

Referring to FIG. 1B, a dielectric material layer 120 may be formed on the etch stop material layer 118. In some embodiments, the material of the dielectric material layer 120 is, for example, silicon oxide or silicon nitride. In some embodiments, the method of forming the dielectric material layer 120 is, for example, a CVD method.

Figure 1C:
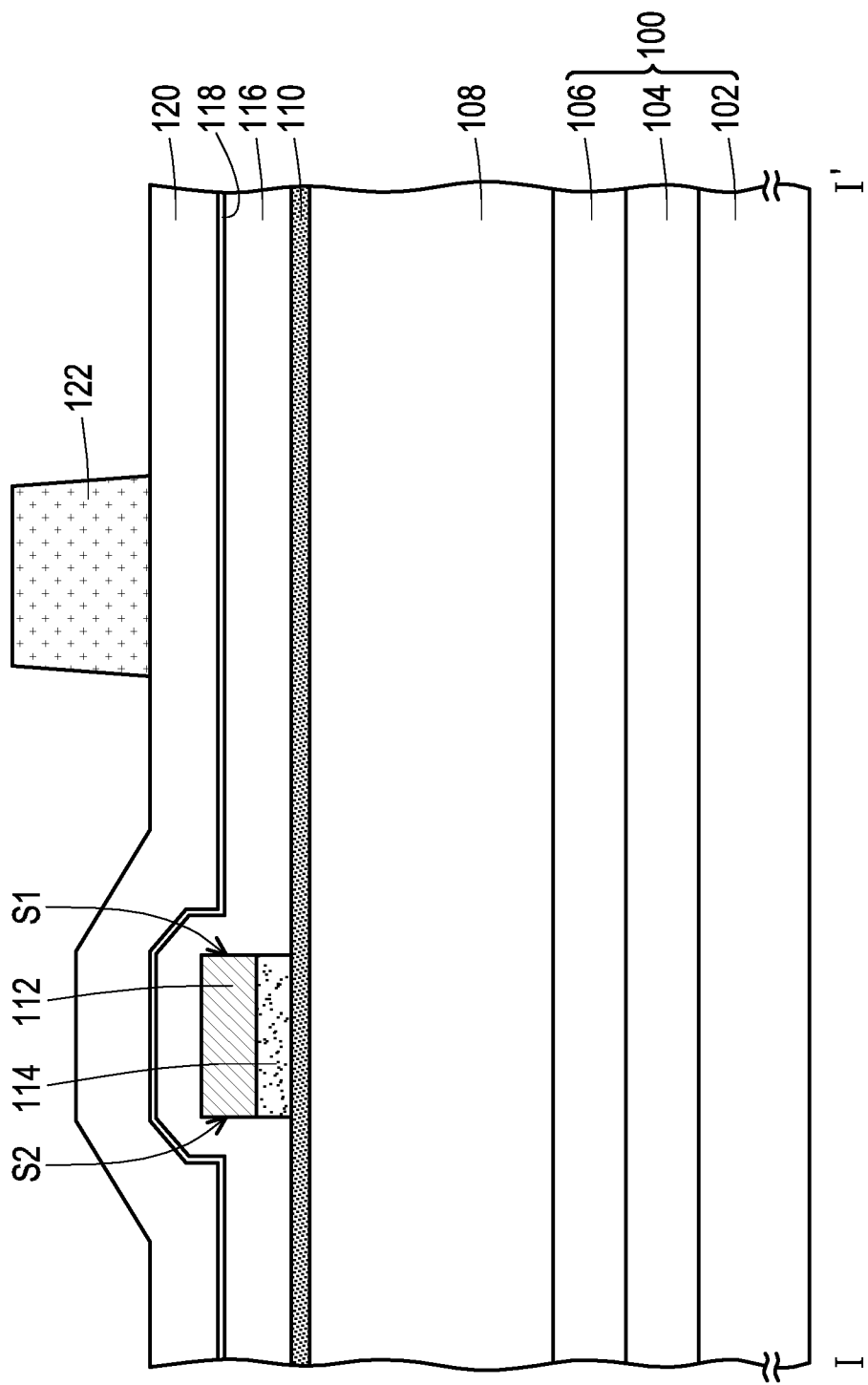

Referring to FIG. 1C, a patterned photoresist layer 122 may be formed on the dielectric material layer 120. In some embodiments, the patterned photoresist layer 122 may be formed by a lithography process.

Figure 1D:
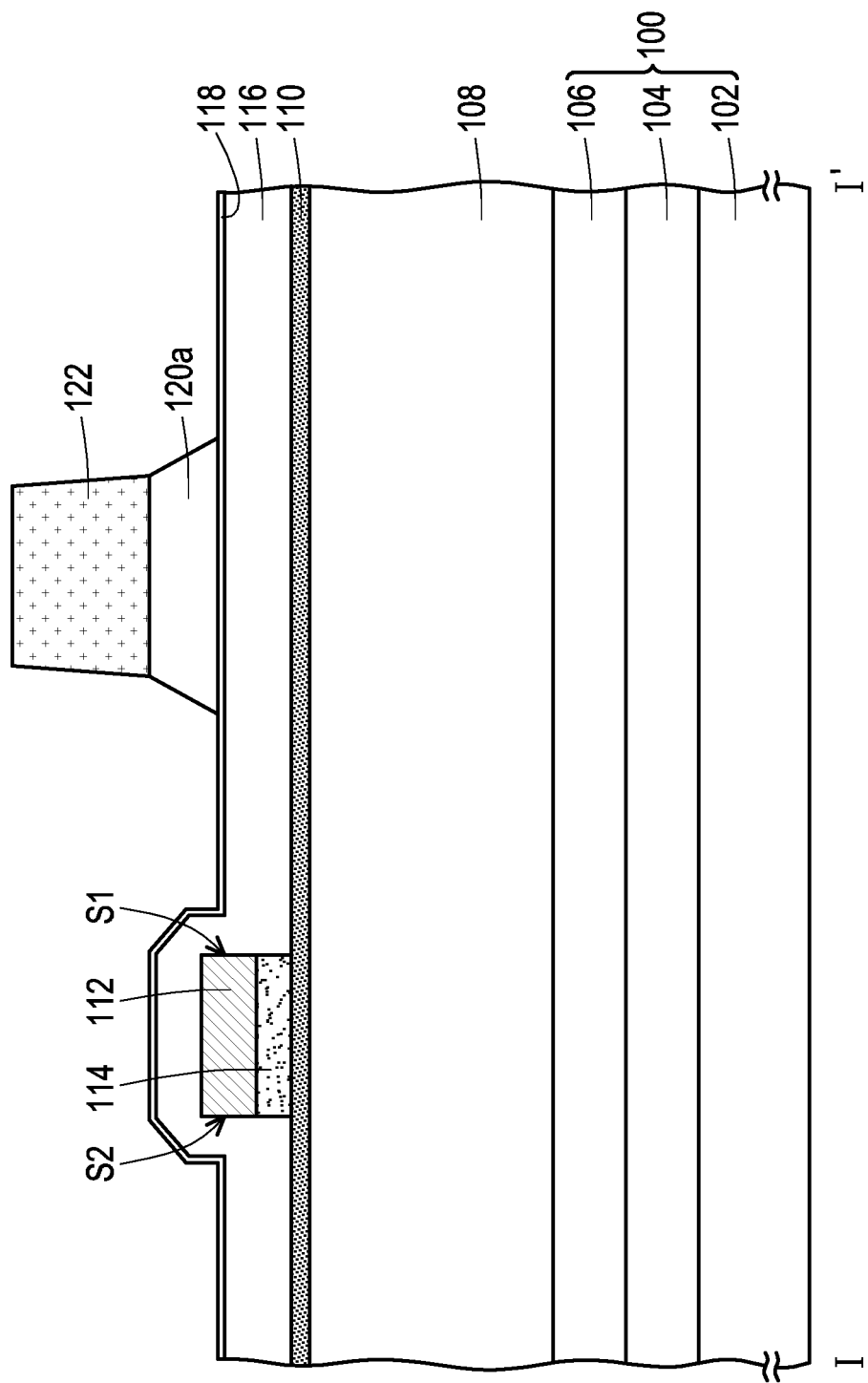

Referring to FIG. 1D, a portion of the dielectric material layer 120 may be removed by using the patterned photoresist layer 122 as a mask to form a dielectric layer 120a. For example, a dry etching process may be performed on the dielectric material layer 120 by using the patterned photoresist layer 122 as a mask and using the etch stop material layer 118 as an etch stop layer to remove the portion of the dielectric material layer 120. Therefore, the dielectric material layer 120 may be patterned to form the dielectric layer 120a and to expose the etch stop material layer 118. In some embodiments, the material of the dielectric layer 120a is, for example, silicon oxide or silicon nitride.

Figure 1E:
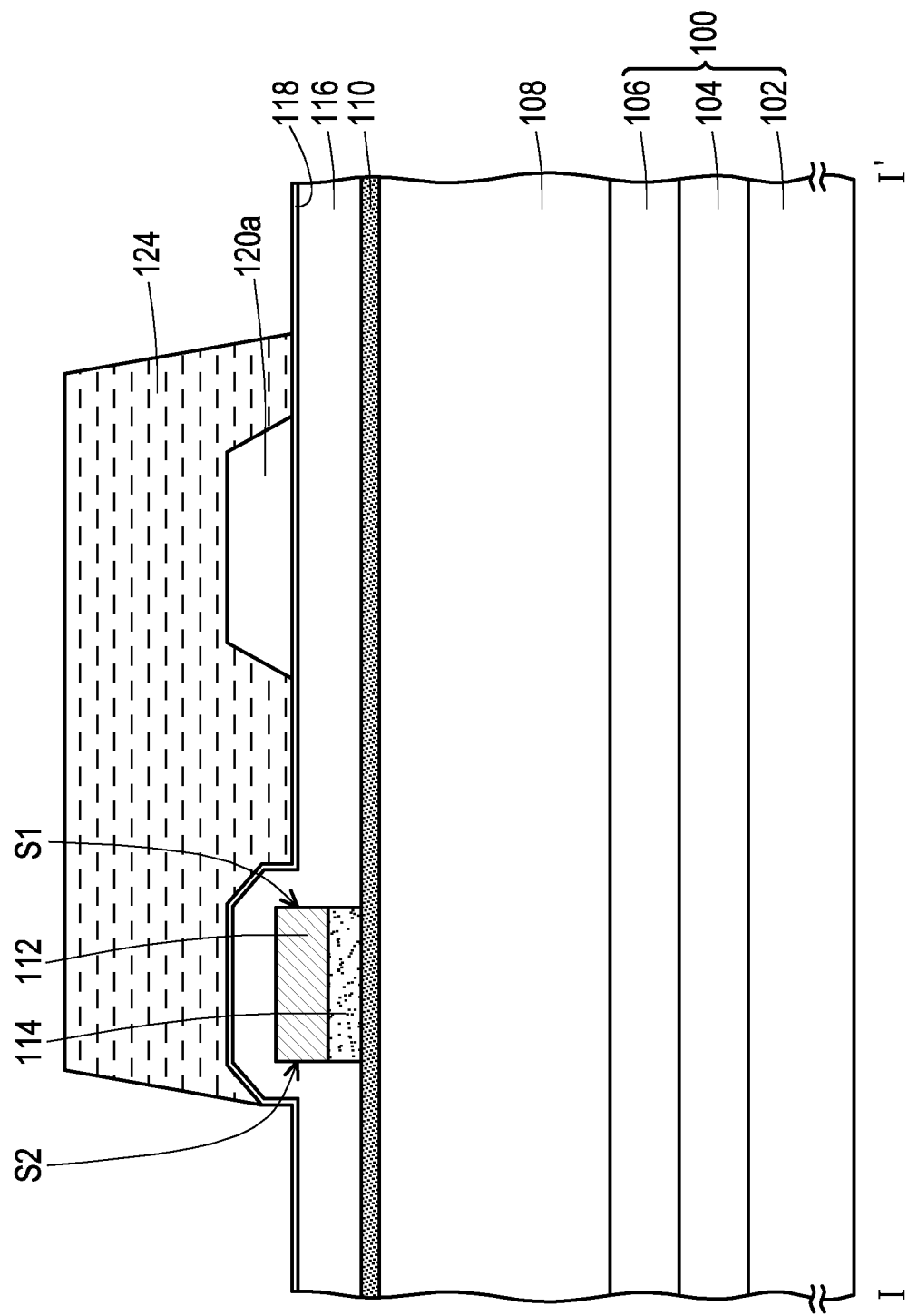

Referring to FIG. 1E, the patterned photoresist layer 122 may be removed. In some embodiments, the method of removing the patterned photoresist layer 122 is, for example, a dry stripping method or a wet stripping method.

A patterned photoresist layer 124 may be formed on the etch stop material layer 118 and the dielectric layer 120a. In some embodiments, the patterned photoresist layer 124 may be formed by a lithography process.

Figure 1F:
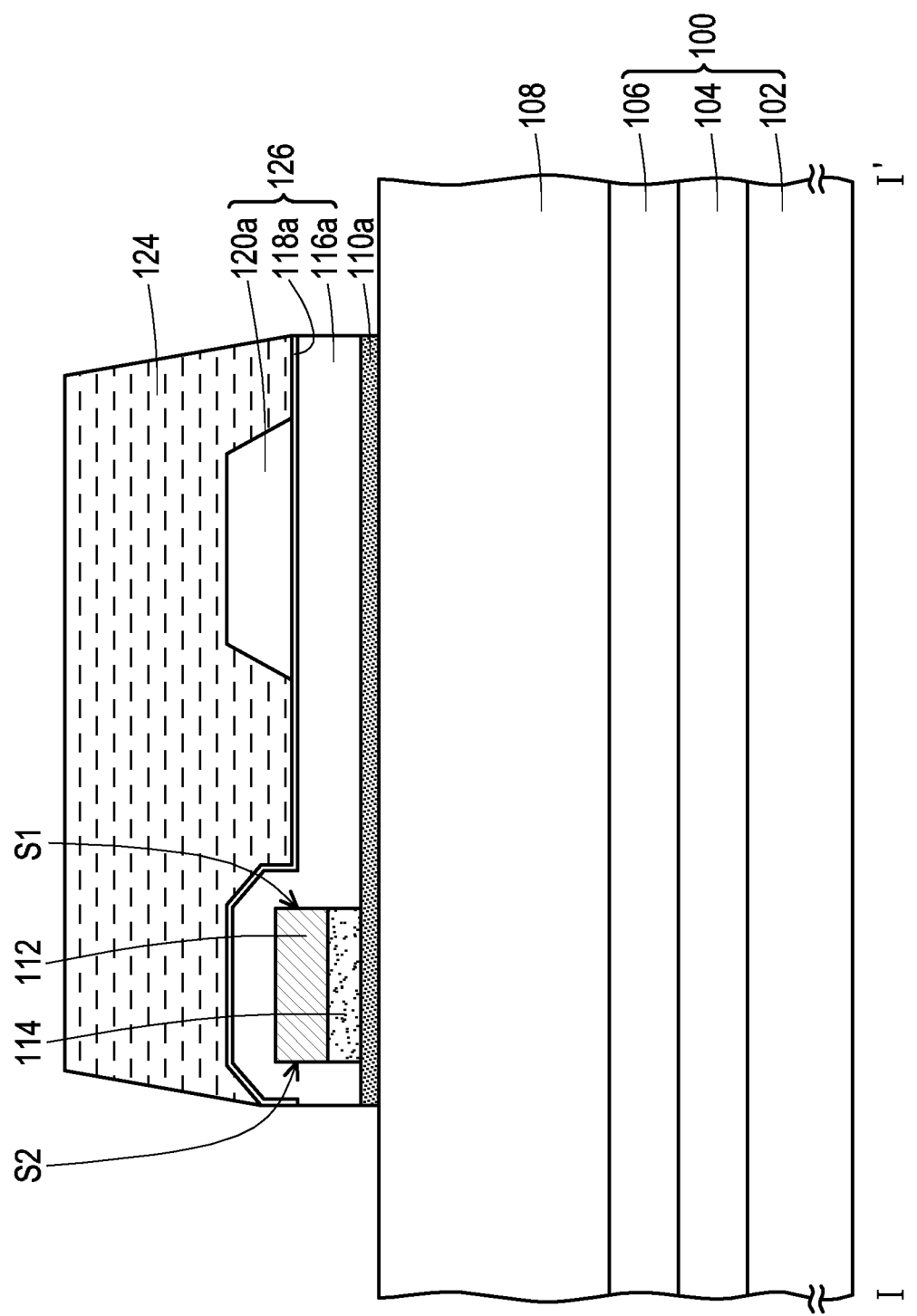

Referring to FIG. 1F, a portion of the etch stop material layer 118, a portion of the dielectric material layer 116, and a portion of the barrier material layer 110 may be removed by using the patterned photoresist layer 124 as a mask to form an etch stop layer 118a, a dielectric layer 116a, and a barrier layer 110a. For example, a dry etching process may be performed on the etch stop material layer 118, the dielectric material layer 116, and the barrier material layer 110 by using the patterned photoresist layer 124 as a mask and using the channel layer 108 as an etch stop layer to remove the portion of the etch stop material layer 118, the portion of the dielectric material layer 116, and the portion of the barrier material layer 110. Therefore, the etch stop material layer 118, the dielectric material layer 116, and the barrier material layer 110 may be patterned to form the etch stop layer 118a, the dielectric layer 116a, and the barrier layer 110a and to expose the channel layer 108. In some embodiments, the material of the etch stop layer 118a is, for example, aluminum oxide or aluminum nitride. In some embodiments, the material of the dielectric layer 116a is, for example, silicon oxide or silicon nitride. In some embodiments, the material of the barrier layer 110a is, for example, aluminum gallium nitride.

By the above method, the barrier layer 110a may be formed on the channel layer 108, the gate electrode 112 may be formed on the barrier layer 110a, the P-type gallium nitride layer 114 may be formed between the gate electrode 112 and the barrier layer 110a, and the dielectric structure 126 may be formed. In some embodiments, the dielectric structure 126 may include the dielectric layer 116a, the dielectric layer 120a, and the etch stop layer 118a. The dielectric layer 116a is located on the barrier layer 110a. The dielectric layer 116a may cover the gate electrode 112 and the P-type gallium nitride layer 114. The dielectric layer 120a is located on the dielectric layer 116a. The etch stop layer 118a is located between the dielectric layer 116a and the dielectric layer 120a.

Figure 1G:
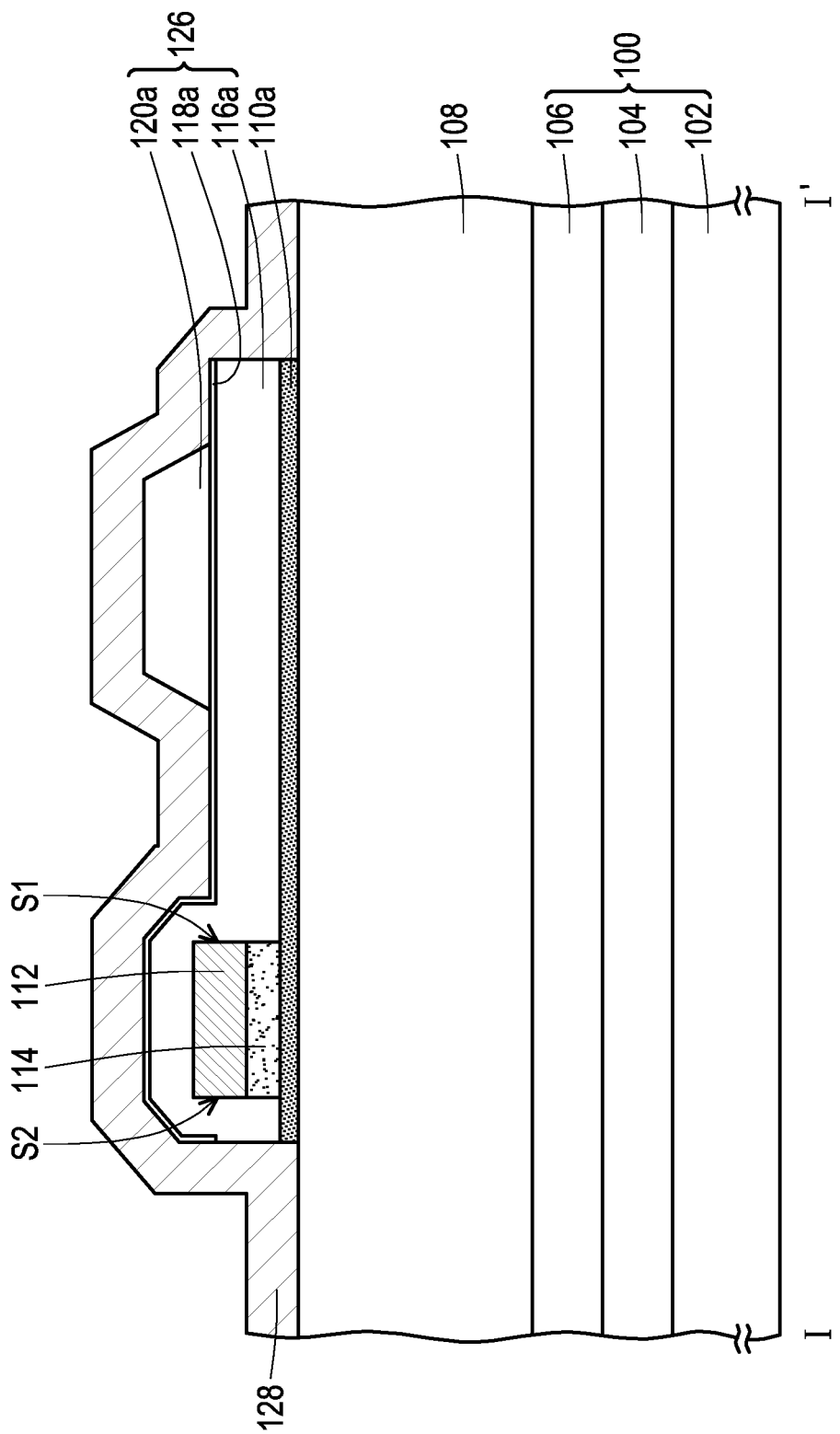

Referring to FIG. 1G, the patterned photoresist layer 124 may be removed. In some embodiments, the method of removing the patterned photoresist layer 124 is, for example, a dry stripping method or a wet stripping method.

A conductive material layer 128 may be formed on the channel layer 108 and the dielectric structure 126. In some embodiments, the material of the conductive material layer 128 is, for example, a conductive material that may form an ohmic contact with the channel layer 108. In some embodiments, the material of the conductive material layer 128 is, for example, titanium, aluminum copper alloy (AlCu), or a combination thereof. In some embodiments, the method of forming the conductive material layer 128 is, for example, a CVD method or a PVD method.

Figure 1H:
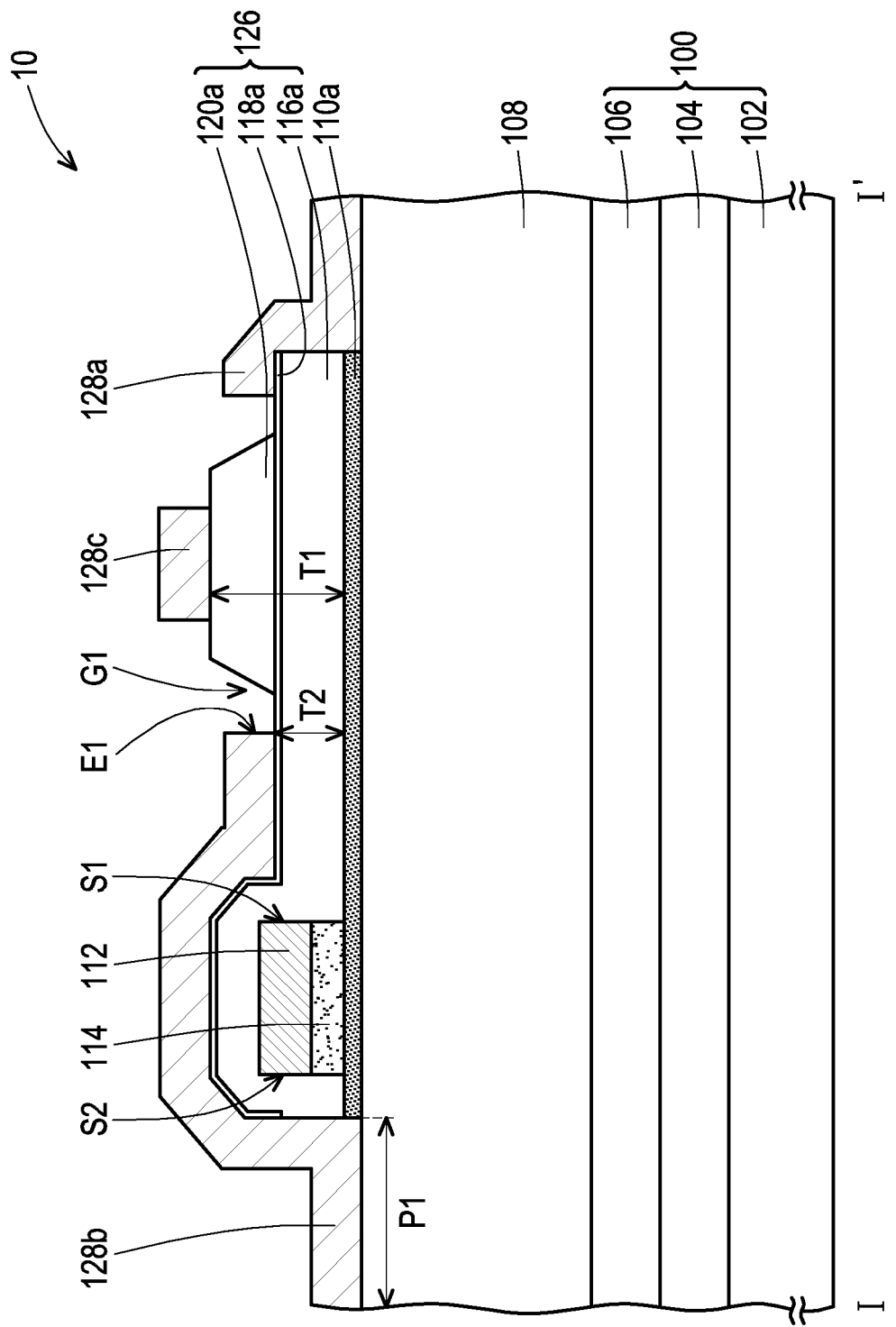

Referring to FIG. 1H and FIG. 2, the conductive material layer 128 may be patterned to form a drain electrode 128a, a source field plate 128b, and a source field plate 128c. The drain electrode 128a is located on the first side S1 of the gate electrode 112. The source field plate 128b extends from the second side S2 of the gate electrode 112 to the first side S1 of the gate electrode 112. The source field plate 128b may pass over the gate electrode 112. The source field plate 128c is located on the first side S1 of the gate electrode 112 and is located between the drain electrode 128a and the source field plate 128b. There is a gap G1 between the top-view pattern of the source field plate 128b and the top-view pattern of the source field plate 128c. The source field plate 128b has an end E1 adjacent to the gap G1. In some embodiments, the source field plate 128b and the source field plate 128c may be derived from the same material layer (e.g., conductive material layer 128). In some embodiments, the source field plate 128b and the source field plate 128c may be simultaneously formed by the same metal process. In some embodiments, the drain electrode 128a, the source field plate 128b, and the source field plate 128c may be derived from the same material layer (e.g., conductive material layer 128). In some embodiments, the drain electrode 128a, the source field plate 128b, and the source field plate 128c may be simultaneously formed by the same metal process. For example, after the conductive material layer 128 is formed, the conductive material layer 128 may be patterned by a lithography process and an etching process (e.g., dry etching process) to simultaneously form the drain electrode 128a, the source field plate 128b, and the source field plate 128c. In some embodiments, the materials of the drain electrode 128a and the source field plate 128b is, for example, a conductive material that may form an ohmic contact with the channel layer 108. In some embodiments, the materials of the drain electrode 128a, the source field plate 128b, and the source field plate 128c are, for example, titanium, aluminum copper alloy, or a combination thereof.

In addition, by the above method, the dielectric structure 126 may be formed between the source field plate 128b and the gate electrode 112, between the source field plate 128b and the barrier layer 110a, and between the source field plate 128c and the barrier layer 110a. The thickness T1 of the dielectric structure 126 located directly below the source field plate 128c is greater than the thickness T2 of the dielectric structure 126 located directly below the end E1 of the source field plate 128b. In some embodiments, the dielectric layer 116a and the etch stop layer 118a may be located directly below the source field plate 128b. The dielectric layer 120a is not located directly below the source field plate 128b. The dielectric layer 116a, the etch stop layer 118a, and the dielectric layer 120a may be located directly below the source field plate 128c. Therefore, the thickness T1 of the dielectric structure 126 located directly below the source field plate 128c may be greater than the thickness T2 of the dielectric structure 126 located directly below the end E1 of the source field plate 128b.

Hereinafter, the HEMT device 10 of the above embodiment is described with reference to FIG. 1H and FIG. 2. In addition, although the method for forming the HEMT device 10 is described by taking the above method as an example, the invention is not limited thereto.

Referring to FIG. 1H and FIG. 2, the HEMT device 10 includes a substrate structure 100, a channel layer 108, a barrier layer 110a, a gate electrode 112, a drain electrode 128a, a source field plate 128b, a source field plate 128c, and a dielectric structure 126. In some embodiments, the substrate structure 100 may include a substrate 102, a nucleation layer 104, and a buffer layer 106. The nucleation layer 104 is located on the substrate 102. The buffer layer 106 is located on the nucleation layer 104. The channel layer 108 is located on the substrate structure 100. The barrier layer 110a is located on the channel layer 108. The gate electrode 112 is located on the barrier layer 110a. The gate electrode 112 has a first side S1 and a second side S2 opposite to each other. In some embodiments, the HEMT device 10 may further include a P-type gallium nitride layer 114. The P-type gallium nitride layer 114 is located between the gate electrode 112 and the barrier layer 110a.

The drain electrode 128a is located on the first side S1 of the gate electrode 112. In some embodiments, a portion of the drain electrode 128a may extend onto the top surface of the dielectric structure 126. In some embodiments, the drain electrode 128a may be connected to the channel layer 108.

The source field plate 128b extends from the second side S2 of the gate electrode 112 to the first side S1 of the gate electrode 112. The source field plate 128b may pass over the gate electrode 112. The portion P1 of the source field plate 128b located on the second side S2 of the gate electrode 112 may be used as a source electrode. In some embodiments, the source field plate 128b located on the second side S2 of the gate electrode 112 may be connected to the channel layer 108. In some embodiments, a portion of the source field plate 128b may be located directly above the gate electrode 112.

The source field plate 128c is located on the first side S1 of the gate electrode 112 and is located between the drain electrode 128a and the source field plate 128b. There is a gap G1 between the top-view pattern of the source field plate 128b and the top-view pattern of the source field plate 128c. The source field plate 128b has an end E1 adjacent to the gap G1. In some embodiments, the vertical projection of the entire source field plate 128c does not fall on the source field plate 128b. That is, the top-view pattern of the entire source field plate 128c may not overlap the top-view pattern of the source field plate 128b. In some embodiments, the source field plate 128b and the source field plate 128c may be derived from the same material layer (e.g., conductive material layer 128 of FIG. 1G). In some embodiments, the drain electrode 128a, the source field plate 128b, and the source field plate 128c may derived from the same material layer (e.g., conductive material layer 128 of FIG. 1G).

The source field plate 128b and the source field plate 128c may be electrically connected to each other. In some embodiments, as shown in FIG. 2, the source field plate 128b may be directly connected to the source field plate 128c. In some embodiments, as shown in FIG. 2, the source field plate 128b and the source field plate 128c may be integrally formed.

The dielectric structure 126 is located between the source field plate 128b and the gate electrode 112, between the source field plate 128b and the barrier layer 110a, and between the source field plate 128c and the barrier layer 110a. In addition, the dielectric structure 126 may be further located between the source field plate 128b and the P-type gallium nitride layer 114. The thickness T1 of the dielectric structure 126 located directly below the source field plate 128c is greater than the thickness T2 of the dielectric structure 126 located directly below the end E1 of the source field plate 128b. Therefore, the breakdown voltage of the HEMT device 10 can be increased. In addition, when the reliability test is performed on the HEMT device 10, the dispersion of the turn-on resistance ($R_{on}$) of the HEMT device 10 under multiple switching operations can be more concentrated. In this way, the HEMT device 10 can have better dynamic performance.

In some embodiments, the dielectric structure 126 may include a dielectric layer 116a, a dielectric layer 120a, and an etch stop layer 118a. The dielectric layer 116a is located on the barrier layer 110a. The dielectric layer 116a may cover the gate electrode 112 and the P-type gallium nitride layer 114. The dielectric layer 120a is located on the dielectric layer 116a. The etch stop layer 118a is located between the dielectric layer 116a and the dielectric layer 120a. In some embodiments, the dielectric layer 116a and the etch stop layer 118a may be located directly below the source field plate 128b. The dielectric layer 120a is not located directly below the source field plate 128b. The dielectric layer 116a, the etch stop layer 118a, and the dielectric layer 120a may be located directly below the source field plate 128c. Therefore, the thickness T1 of the dielectric structure 126 located directly below the source field plate 128c may be greater than the thickness T2 of the dielectric structure 126 located directly below the end E1 of the source field plate 128b.

In addition, the details (e.g., the material and the forming method) of each component in the HEMT device 10 have been described in detail in the above embodiments, and the description thereof is not repeated here.

Based on the above embodiments, in the HEMT device 10 and the manufacturing method thereof, the source field plate 128c is located between the drain electrode 128a and the source field plate 128b. There is a gap G1 between the top-view pattern of the source field plate 128b and the top-view pattern of the source field plate 128c. The source field plate 128b has an end E1 adjacent to the gap G1. The thickness T1 of the dielectric structure 126 located directly below the source field plate 128c is greater than the thickness T2 of the dielectric structure 126 located directly below the end E1 of the source field plate 128b. Therefore, the breakdown voltage of the HEMT device 10 can be increased. In addition, when the reliability test is performed on the HEMT device 10, the dispersion of the turn-on resistance ($R_{on}$) of the HEMT device 10 under multiple switching operations can be more concentrated. In this way, the HEMT device 10 can have better dynamic performance.

Figure 3:
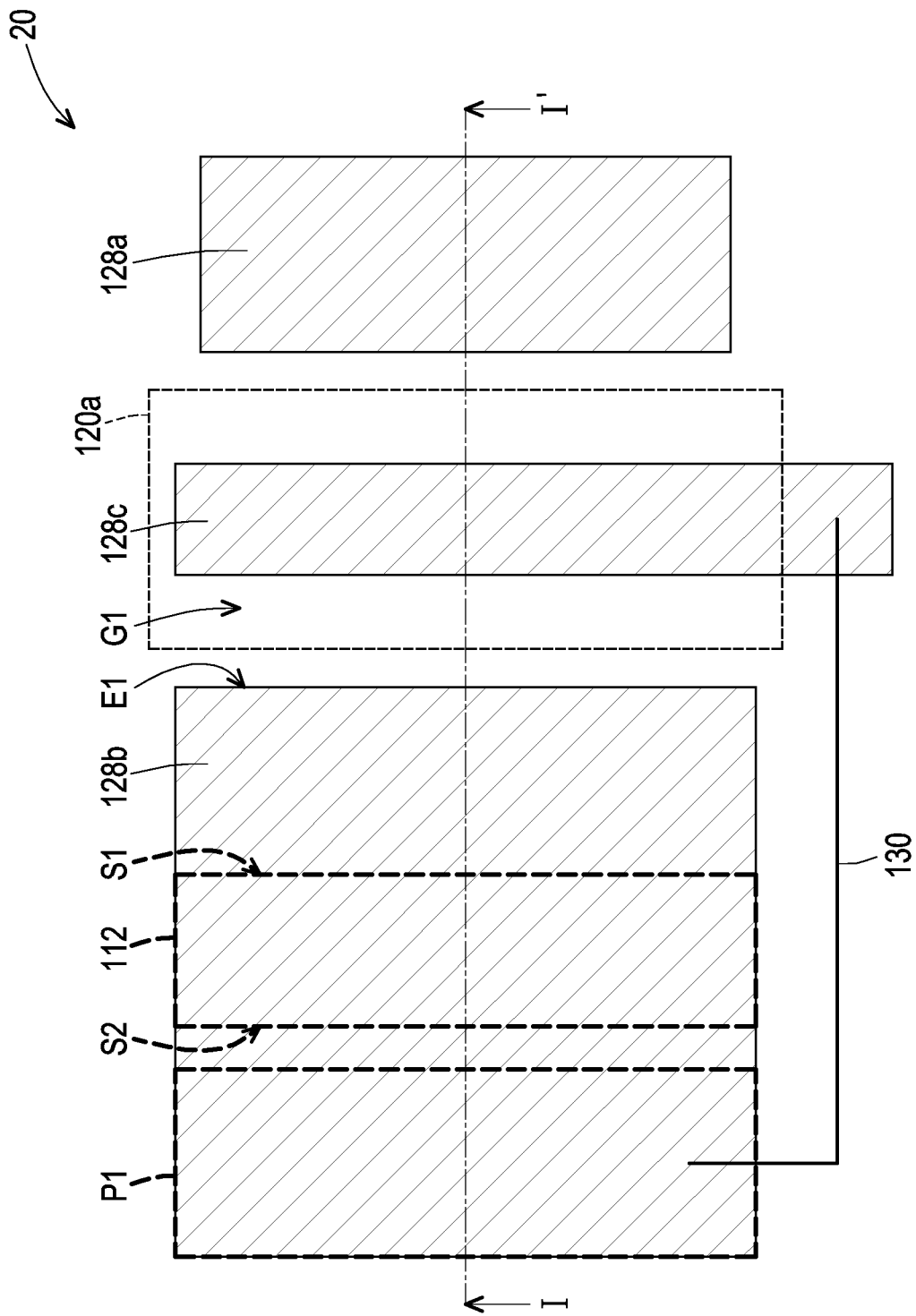
FIG. 3 is a top view of a HEMT device according to other embodiments of the invention.

FIG. 3 is a top view of a HEMT device according to other embodiments of the invention.

Referring to FIG. 2 and FIG. 3, the difference between the HEMT device 20 of FIG. 3 and the HEMT device 10 of FIG. 2 is as follows. In the HEMT device 20 of FIG. 3, the source field plate 128b and the source field plate 128c may be separated from each other. In addition, the HEMT device 20 may further include an interconnect structure 130. The source field plate 128b and the source field plate 128c may be electrically connected to each other by the interconnect structure 130. In FIG. 3, the interconnect structure 130 is represented by a line to simplify the figure. In some embodiments, the interconnect structure 130 may include a contact, a conductive line, or a combination thereof.

In some embodiments, the HEMT device 20 may have a cross-sectional structure as shown in FIG. 1H. Therefore, in the HEMT device 20, the thickness T1 of the dielectric structure 126 located directly below the source field plate 128c is greater than the thickness T2 of the dielectric structure 126 located directly below the end E1 of the source field plate 128b.

In addition, in the HEMT device 10 of FIG. 2 and the HEMT device 20 of FIG. 3, the same or similar components are denoted by the same reference symbols, and the description thereof is omitted. Furthermore, the details (e.g., the material and the forming method) of each component in the HEMT device 20 may refer to the description of the embodiment of the HEMT device 10, and the description thereof is omitted here.

Based on the above embodiments, in the HEMT device 20 and the manufacturing method thereof, the source field plate 128c is located between the drain electrode 128a and the source field plate 128b. There is a gap G1 between the top-view pattern of the source field plate 128b and the top-view pattern of the source field plate 128c. The source field plate 128b has an end E1 adjacent to the gap G1. The thickness T1 of the dielectric structure 126 located directly below the source field plate 128c is greater than the thickness T2 of the dielectric structure 126 located directly below the end E1 of the source field plate 128b. Therefore, the breakdown voltage of the HEMT device 20 can be increased. In addition, when the reliability test is performed on the HEMT device 20, the dispersion of the turn-on resistance ($R_{on}$) of the HEMT device 20 under multiple switching operations can be more concentrated. In this way, the HEMT device 20 can have better dynamic performance.

In summary, the HEMT device and the manufacturing method thereof of the aforementioned embodiments can increase the breakdown voltage of the HEMT device. In addition, when the reliability test is performed on the HEMT device of the aforementioned embodiments, the dispersion of the turn-on resistance ($R_{on}$) of the HEMT device under multiple switching operations can be more concentrated. In this way, the HEMT device of the aforementioned embodiments can have better dynamic performance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A high electron mobility transistor (HEMT) device, comprising:
   a substrate structure;
   a channel layer located on the substrate structure;
   a barrier layer located on the channel layer;
   a gate electrode located on the barrier layer and having a first side and a second side opposite to each other;
   a drain electrode located on the first side of the gate electrode;
   a first source field plate extending from the second side of the gate electrode to the first side of the gate electrode;
   a second source field plate located on the first side of the gate electrode and located between the drain electrode and the first source field plate, wherein there is a gap between a top-view pattern of the first source field plate and a top-view pattern of the second source field plate, and the first source field plate has an end adjacent to the gap; and
   a dielectric structure located between the first source field plate and the gate electrode, between the first source field plate and the barrier layer, and between the second source field plate and the barrier layer, wherein
   a thickness of the dielectric structure located directly below the second source field plate is greater than a thickness of the dielectric structure located directly below the end of the first source field plate.

2. The HEMT device according to claim 1, wherein the first source field plate and the second source field plate are derived from the same material layer.

3. The HEMT device according to claim 1, wherein a portion of the first source field plate is located directly above the gate electrode.

4. The HEMT device according to claim 1, wherein the first source field plate and the second source field plate are electrically connected to each other.

5. The HEMT device according to claim 1, wherein the first source field plate is directly connected to the second source field plate.

6. The HEMT device according to claim 1, wherein the first source field plate and the second source field plate are separated from each other.

7. The HEMT device according to claim 6, further comprising:
an interconnect structure, wherein the first source field plate and the second source field plate are electrically connected to each other by the interconnect structure.

8. The HEMT device according to claim 1, wherein the dielectric structure comprises:
a first dielectric layer located on the barrier layer;
a second dielectric layer located on the first dielectric layer; and
an etch stop layer located between the first dielectric layer and the second dielectric layer.

9. The HEMT device according to claim 8, wherein
the first dielectric layer and the etch stop layer are located directly below the first source field plate,
the second dielectric layer is not located directly below the first source field plate, and
the first dielectric layer, the etch stop layer, and the second dielectric layer are located directly below the second source field plate.

10. The HEMT device according to claim 1, wherein the drain electrode is connected to the channel layer.

11. The HEMT device according to claim 1, wherein the first source field plate located on the second side of the gate electrode is connected to the channel layer.

12. The HEMT device according to claim 1, further comprising:
a P-type gallium nitride layer located between the gate electrode and the barrier layer.

13. The HEMT device according to claim 1, wherein the substrate structure comprises:
a substrate;
a nucleation layer located on the substrate; and
a buffer layer located on the nucleation layer.

14. A manufacturing method of a HEMT device, comprising:
providing a substrate structure;
forming a channel layer on the substrate structure;
forming a barrier layer on the channel layer;
forming a gate electrode on the barrier layer, wherein the gate electrode has a first side and a second side opposite to each other;
forming a drain electrode, a first source field plate, and a second source field plate, wherein the drain electrode is located on the first side of the gate electrode, and the first source field plate extends from the second side of the gate electrode to the first side of the gate electrode, the second source field plate is located on the first side of the gate electrode and is located between the drain electrode and the first source field plate, there is a gap between a top-view pattern of the first source field plate and a top-view pattern of the second source field plate, and the first source field plate has an end adjacent to the gap; and
forming a dielectric structure between the first source field plate and the gate electrode, between the first source field plate and the barrier layer, and between the second source field plate and the barrier layer, wherein
a thickness of the dielectric structure located directly below the second source field plate is greater than a thickness of the dielectric structure located directly below the end of the first source field plate.

15. The manufacturing method of the HEMT device according to claim 14, wherein the first source field plate and the second source field plate are simultaneously formed by the same metal process.

16. The manufacturing method of the HEMT device according to claim 14, wherein the dielectric structure comprises:
a first dielectric layer located on the barrier layer;
a second dielectric layer located on the first dielectric layer; and
an etch stop layer located between the first dielectric layer and the second dielectric layer.

17. The manufacturing method of the HEMT device according to claim 16, wherein
the first dielectric layer and the etch stop layer are located directly below the first source field plate,
the second dielectric layer is not located directly below the first source field plate, and
the first dielectric layer, the etch stop layer, and the second dielectric layer are located directly below the second source field plate.

18. The manufacturing method of the HEMT device according to claim 17, wherein a method of forming the barrier layer, the first dielectric layer, the etch stop layer, and the second dielectric layer comprises:
forming a barrier material layer on the channel layer;
forming the gate electrode on the barrier material layer;
forming a first dielectric material layer on the barrier material layer and the gate electrode;
forming an etch stop material layer on the first dielectric material layer;
forming a second dielectric material layer on the etch stop material layer;
patterning the second dielectric material layer to form the second dielectric layer and to expose the etch stop material layer; and
patterning the etch stop material layer, the first dielectric material layer, and the barrier material layer to form the etch stop layer, the first dielectric layer, and the barrier layer and to expose the channel layer.

19. The manufacturing method of the HEMT device according to claim 14, wherein a method of forming the drain electrode, the first source field plate, and the second source field plate comprises:
forming a conductive material layer on the channel layer and the dielectric structure; and
patterning the conductive material layer to form the drain electrode, the first source field plate, and the second source field plate.

20. The manufacturing method of the HEMT device according to claim 14, further comprising:
forming a P-type gallium nitride layer between the gate electrode and the barrier layer.

* * * * *